(12) United States Patent
Arcus

(10) Patent No.: US 6,801,080 B1
(45) Date of Patent: Oct. 5, 2004

(54) CMOS DIFFERENTIAL INPUT BUFFER WITH SOURCE-FOLLOWER INPUT CLAMPS

(75) Inventor: Christopher G. Arcus, San Jose, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 51 days.

(21) Appl. No.: 10/249,414

(22) Filed: Apr. 7, 2003

(51) Int. Cl.$^7$ .............................................. G06G 7/26
(52) U.S. Cl. ...................... 327/563; 327/379; 330/253
(58) Field of Search ................................ 327/108, 374, 327/379, 560–563; 330/252, 253, 261, 164, 255, 269, 277, 288, 295, 296; 326/21–24, 63, 68

(56) References Cited

U.S. PATENT DOCUMENTS

| | | | |
|---|---|---|---|
| 3,679,989 A | 7/1972 | Thibodeau | 330/185 |
| 4,206,418 A | 6/1980 | Dingwall | 330/253 |
| 4,808,944 A * | 2/1989 | Taylor | 330/253 |
| 4,935,649 A | 6/1990 | Bloker | 327/51 |
| 4,945,262 A | 7/1990 | Piasecki | 326/68 |
| 5,196,744 A | 3/1993 | Neu | 327/309 |
| 5,256,917 A | 10/1993 | Flannagan et al. | 326/33 |
| 5,315,179 A * | 5/1994 | Pelley, III et al. | 326/64 |
| 5,570,042 A | 10/1996 | Ma | 326/63 |
| 5,585,743 A * | 12/1996 | Kenji et al. | 326/73 |
| 5,701,102 A * | 12/1997 | Kuo | 330/253 |
| 5,869,985 A * | 2/1999 | Wang et al. | 326/109 |
| 5,898,341 A * | 4/1999 | Miyashita | 330/253 |
| 5,942,921 A | 8/1999 | Talaga | 327/77 |
| 5,973,561 A * | 10/1999 | Heaton | 330/252 |
| 5,990,708 A | 11/1999 | Hu | 327/68 |
| 6,094,093 A * | 7/2000 | Karanicolas | 327/560 |
| 6,107,856 A | 8/2000 | Bitting | 327/307 |
| 6,114,872 A | 9/2000 | Takahashi | 326/23 |
| 6,265,926 B1 | 7/2001 | Wong | 327/318 |
| 6,456,137 B1 * | 9/2002 | Asao | 327/290 |
| 6,496,070 B2 * | 12/2002 | Kubota | 330/277 |
| 6,525,607 B1 * | 2/2003 | Liu | 330/253 |
| 6,528,978 B2 * | 3/2003 | Lim | 323/313 |
| 6,552,611 B2 * | 4/2003 | Yamamoto | 330/253 |
| 6,583,668 B1 * | 6/2003 | Liu et al. | 330/254 |

* cited by examiner

Primary Examiner—Timothy P. Callahan
Assistant Examiner—Hai L. Nguyen
(74) Attorney, Agent, or Firm—Stuart T. Auvinen

(57) ABSTRACT

A differential input buffer shows reduced sensitivity to input conditions such as input-trace loading and upstream driver characteristics. Varying input conditions can be measured as differences in amplitude, slew rate, and common-mode offset. Wide input-voltage swings are clamped to a limited voltage range by an input clamp circuit that uses source followers to drive p-channel clamp transistors that turn off when the input voltage is too low. A voltage divider then sets the lowest voltage input to a differential stage. The differential stage receives the clamped inputs and has two tail current sinks to reduce delay sensitivity to charging and discharging of tail capacitances. A middle voltage is applied to transistors opposite the differential transistors that receive the clamped input voltages. A bias voltage for the tail current sinks is generated by mirroring currents and setting a gate voltage by injecting and removing a same bias current from a resistor.

19 Claims, 6 Drawing Sheets

CMOS DIFFERENTIAL INPUT BUFFER WITH SOURCE-FOLLOWER INPUT CLAMPS

BACKGROUND OF INVENTION

This invention relates to differential input buffers, and more particularly to differential buffers that are relatively insensitive to input conditions.

Matching of delays in electronic circuits is a long-standing design challenge. One of many applications that require matched delays is a zero-delay buffer that uses a PLL to synchronize outputs to inputs. The PLL adjusts the circuit delay to exactly match the clock period and thus the apparent delay of the zero-delay buffer is zero with respect to the clock.

FIG. 1 shows a zero-delay buffer that requires precise delay matching. Zero-delay buffer chip 10 may be integrated with a larger system or may be sold as a stand-alone zero-delay chip. Clock source 18 generates a reference clock CLK that is input to chip 10. This reference clock passes through input buffer 22 and is compared in phase to a feedback clock FB that passes through a similar input buffer 24. Phase comparator 12 compares the phases of CLK and FB and activates charge pump 14 to charge or discharge filter capacitor 20. As capacitor 20 is charged or discharged, the voltage across capacitor 20 changes, and voltage-controlled oscillator VCO 16 senses the capacitor voltage and adjusts the output frequency of an output clock that is buffered by output buffer 26.

The FB clock output by buffer 26 can drive other logic directly, or additional internal or external buffering can generate other clocks. Many PLL's can be included in parallel to separately drive and adjust parallel clock lines that are synchronized to each other and to the reference clock.

Input buffers 22, 24 must to have closely matched delays. Otherwise a phase error is introduced that can cause VCO 16 to output the wrong frequency. The physical design of input buffers 22, 24 can be closely matched to avoid skews. Unfortunately, the electrical characteristics of the signal traces and drivers of the reference clock and feedback clock can differ. For example, clock source 18 may have a different driver than output buffer 26, and may drive less current or may drive signal edges more slowly. The metal traces for CLK and FB may also differ. For example the FB clock trace may be much shorter than the reference clock CLK trace. Thus the input conditions of the signals input to input buffers 22, 24 can differ considerably. Input buffers that can adapt for such external mis-matches are desirable.

There are many measurable input conditions that can mismatch as a result of such differences in external drivers and traces. For example, measurements of rise and fall times or slew rates, high and low amplitudes and even root-mean-square (RMS) voltages of signals can differ. Often differential rather than single-ended signals are used. Then additional input-signal characteristics can be mis-matched, such as differential crossing or cross-over points and common-mode voltages.

One commonly-used circuit for input buffers is the differential amplifier. FIG. 2 shows a prior-art differential input buffer. Inputs signals V+, V− are applied to the gates of n-channel differential transistors 36, 38, respectively. Resistor loads 32, 34 supply matched currents to transistors 36, 38, and these currents are combined at current sink 30. Differential outputs VO−, VO+ are taken from the drains of transistors 36, 38, respectively.

Such a differential buffer is delay-independent of common-mode level within a certain range. The differential transistors tend to linearize I/Vin, for a range of about 2 ΔV, where ΔV is the gate bias of transistors 36, 38, or Vgs–Vt, where Vgs is the average gate-to-source voltage and Vt is the n-channel transistor threshold voltage. However, non-linear delays occur beyond this 2 ΔV range.

One source of delay variation is the parasitic tail capacitance represented by tail capacitor 28. When inputs V+, V− differ by more than 2 ΔV, one of differential transistors 36, 38 may turn off completely. All of the tail current then flows through the other differential transistor. As the input voltage V+ or V− rises even more, the tail voltage also rises rather than remaining constant. The rising tail voltage charges tail capacitor 28, requiring some of the current.

It is thus desirable to avoid operating at higher input voltages where such delay variations due to charging and discharging of the tail capacitance occur. It is desirable to avoid large differences in differential input voltages V+, V−. It is desired to limit the difference between differential inputs V+, V−. Adjusting for input conditions that exceed 2 ΔV is desirable to produce better delay matching of differential input buffers.

DETAILED DESCRIPTION

The present invention relates to an improvement in differential buffers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that input buffers can better match in delay when input voltages do not have wide swings. An input clamp on the differential inputs limits the voltages of the differential inputs before they are applied to a differential amplifier. This input clamp prevents the clamped differential inputs from differing by more than the unclamped input, preventing non-linear effects caused by charging and discharging of tail capacitance.

Figure 3:
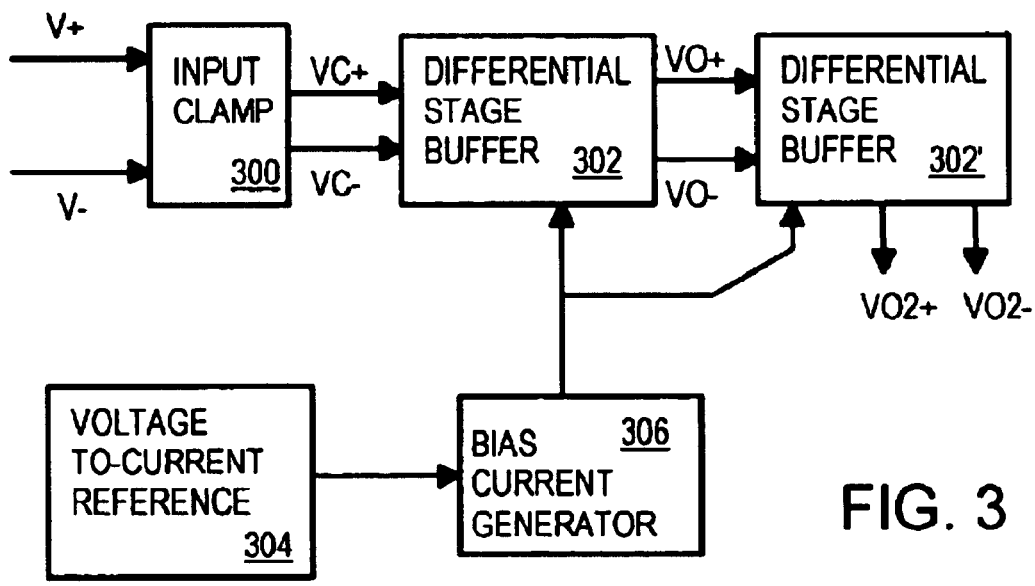
FIG. 3 is a block diagram of a clamped differential input buffer with a well-controlled bias circuit.

FIG. 3 is a block diagram of a clamped differential input buffer with a well-controlled bias circuit. Input clamp 300 receives differential inputs V+, V−. When V+ or V− are above a limiting voltage level, input clamp 300 reduces the input voltage to the limiting voltage. Otherwise the inputs are level-shifted and output as clamped differential inputs VC+, VC−.

First differential stage 302 receives the clamped differential inputs VC+, VC−. The clamped differential inputs are limited in voltage. The voltage differential is allowed to be slightly more than 2 ΔV, but is clamped at less than the full input swing, allowing first differential stage 302 to operate in the linear range. This prevents large delay mis-matches caused by charging and discharging the tail capacitor. First differential stage 302 generates differential outputs VO+, VO− which may be further amplified by second differential stage 302', which generates final outputs VO2+, VO2−. The second differential stage is optional but desirable.

A well-controlled bias voltage is required for the tail current source in the differential stages 302, 302'. This bias voltage is generated by bias current generator 306, which mirrors a current generated by voltage-to-current reference 304.

Figure 4:
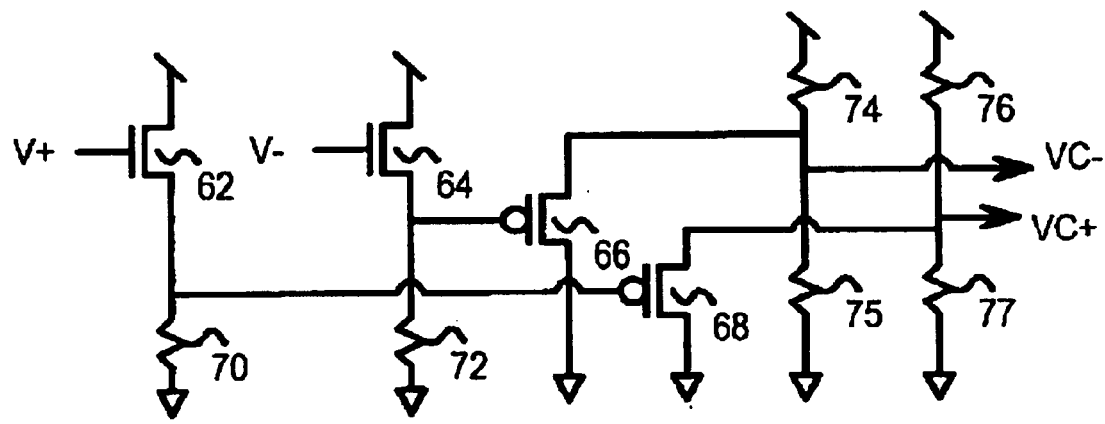
FIG. 4 is a schematic of one embodiment of the differential input clamp.

FIG. 4 is a schematic of one embodiment of the differential input clamp. Input clamp 300 receives differential inputs V+, V− which are applied to the gates of n-channel follower transistors 62, 64, respectively. Follower transistors 62, 64 act as source-followers, shifting the input voltages V+, V− lower by at least a threshold. Resistors 70, 72 sink current from follower transistors 62, 64 respectively.

The source output of n-channel follower transistor 62 is applied to the gate of p-channel clamp transistor 68, which has its drain grounded. The source of p-channel clamp transistor 68 is the clamped output VC+. Resistors 76, 77 form a voltage divider to clamped output VC+ that set the clamped voltage level when p-channel clamp transistor 68 is shut off.

Likewise, the source output of n-channel follower transistor 64 is applied to the gate of p-channel clamp transistor 66, which has its drain grounded. The source of p-channel clamp transistor 66 is the clamped output VC−. Resistors 74, 75 form a voltage divider to clamped output VC− that set the clamped voltage level when p-channel clamp transistor 66 is shut off.

When V+ is below the lower clamped voltage input level, n-channel follower transistor 62 turns off, and resistor 70 drives the gate of p-channel clamp transistor 68 to ground, turning it on. Since the drain and gate of p-channel clamp transistor 68 are grounded, it is in the saturated region of operation and its source is clamped to one threshold above its gate, or |Vtp|. The lower clamped voltage of VC+ is about |Vtp|, plus some adjustment from voltage divider resistors 76, 77.

When V+ is above the clamped voltage input level, n-channel follower transistor 62 is on strongly, pulling the gate of p-channel clamp transistor 68 high. When a sufficiently high voltage is applied, p-channel clamp transistor 68 turns off. Then resistors 76, 77 form a voltage divider that determines the upper clamped voltage output on VC+.

Note that the clamped voltage input levels on inputs V+, V− can be different from the clamped voltages on clamped outputs VC+, VC−. Indeed, a benefit of this embodiment of input clamp 300 is that the maximum clamped output voltages can be set by sizing the voltage-divider resistors while the minimum clamped output voltage is set by the p-channel threshold |Vtp|.

Figure 5:
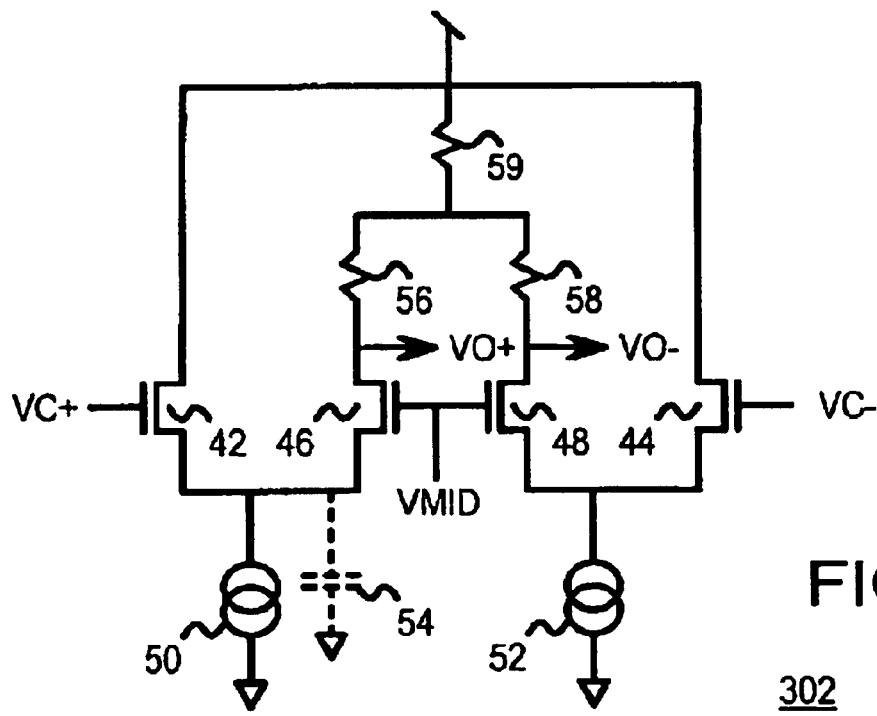
FIG. 5 is a schematic of an embodiment of the first differential stage.

FIG. 5 is a schematic of an embodiment of the first differential stage. First differential stage 302 receives clamped differential inputs VC+, VC− from input clamp 300 that are limited in voltage swing. This limited input-voltage swing limits charging and discharging of tail capacitances such as tail capacitor 54, reducing non-linearities.

Clamped differential input VC+ is applied to the gate of n-channel differential transistor 42, while input VC− is applied to the gate of n-channel differential transistor 44. Rather than have both differential transistors 42, 44 connect to the same current sink, separate current sinks 50, 52 connect to transistors 42, 44, respectively.

Current sink 50 receives currents from differential transistor 42 and n-channel common-mode transistor 46. Similarly, current sink 52 receives currents from differential transistor 44 and n-channel common-mode transistor 48. Common-mode transistors 46, 48 are driven by a common-mode or mid-point voltage VMID, which is between VC+ and VC−. VMID can be generated dynamically by a 50%—50% voltage divider between VC+ and VC−, or it can be generated statically at a pre-determined middle voltage such as 2.0 volts or 1.2 volts. In one embodiment, VMID is generated from the midpoint of two equal-valued resistors in series between the differential inputs. VMID can be isolated further by inserting a capacitor between the resistor mid-points and the use of VMID in the circuit. VMID follows the common-mode input. The center of the clamped differential input is filtered and responds slowly to changes in input common-mode level.

Load current through resistor 59 is split into parallel branches by resistors 56, 58, which connect to the drains of common-mode transistors 46, 48, respectively. A fast rising input induces slew current in Ctail by I=dv/dt. When the slew current exceeds the normal DC bias current Itail, most or all of the extra current dumps into Vdd through transistor 42 or 44, whose drain connects to the Vdd supply. Thus normal operation is relatively undisturbed. An n-type source follower increases Vgs on rising edges to drive a capacitive load. On falling edges, Vgs can only be reduced somewhat, and then the slew is limited by the pulldown bias current, Itail. On rising edges, the current caused by Ctail is as large as the input slew rate demands. If the rising transistor were directly connected to the load, the load would experience an increase in current and a reduction in delay. This is avoided by having transistors 46, 48 with a fixed gate bias (VMID) connected to the output load. Since transistors 46, 48 have a fixed input voltage VMID, they cannot experience delay variations due to gate input slew.

When VC+ rises above VMID, the differential input changes cause the differential outputs of first differential stage 302 to swing. First differential stage 302 is non-inverting. It can be made to invert by swapping VO+ and VO−.

Having clamped input voltages helps to eliminate currents for charging and discharging tail capacitances, such as represented by tail capacitor 54, which is not a real capacitor but instead represents the sum of all parasitic and other capacitances on the tail node.

A second differential stage can be constructed in a similar manner, or a different circuit may be used. A differential-to-single-ended converter may also be included.

Having well-controlled current sinks 50, 52 improves linearity and delay matching. Current sinks 50, 52 can each be implemented as an n-channel transistor with its source grounded and having a gate driven by a bias voltage. The bias voltage can be generated by a simple bias generator such as a voltage-divider network, or a more complex bias-voltage generator can be used such as described below. Since Vgs varies with temperature and according to other variables, the current source must compensate. The purpose of the bias current is to cause the input differential pair to have a fixed and controlled linear input range 2 ΔV. In this case the 2 ΔV is derived from the most convenient source, Vdd. Any reference, internal or external, could be used instead. Once this is achieved all other results may be obtained by referring to this controlled 2 ΔV.

Figure 6:
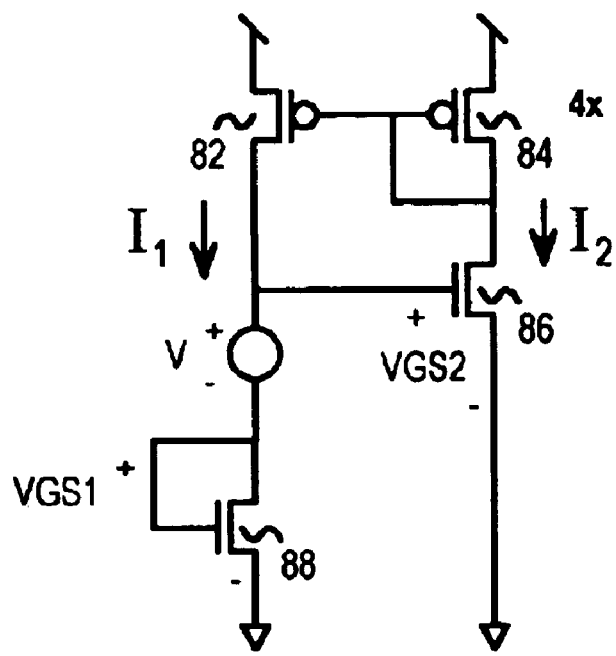
FIG. 6 is a diagram highlighting principles of a current-mirroring bias-voltage generator.

FIG. 6 is a diagram highlighting principles of a current-mirroring bias-voltage generator. The bias voltage to the tail transistors implementing current sinks 50, 52 can be taken from the gate voltage of transistor 86, Vgs2. The gate and drain of p-channel mirror transistor 84 are connected together and to the gate of p-channel mirror transistor 82. The current I2 through p-channel mirror transistor 84 is four times the current I1 through p-channel mirror transistor 82, since transistor 86 has 4 times the W/L ratio of transistor 84. Of course, other current-scaling ratios can be substituted.

Current I2 from mirror transistor 84 is sunk through n-channel transistor 86, which has its gate driven by the drain of mirror transistor 82 as voltage Vgs2.

Current I1 passes through a voltage source that drops the voltage by V before passing through n-channel transistor 88 to ground. The gate and drain of transistor 88 are connected together as Vgs1. Thus Vgs2=Vgs1+V.

Since current through mirror transistors 82, 84 is saturated and follows the saturated current equation $1=0.5*k(W/L)(Vgs-Vt)^2$, where k is a constant, the equation:

$$I2=4*I1$$

can be substituted as:

$$(Vgs2-Vt)=4(Vgs1-Vt)$$

and taking the square root of each side, $$(Vgs2-Vt)=2(Vgs1-Vt).$$

Then removing Vt:

$$Vgs2=2*Vgs1-Vt$$

and substituting Vgs2=Vgs1+V yields:

$$Vgs1+V=2*Vgs1-Vt$$

$$V=Vgs1-Vt.$$

Figure 7:
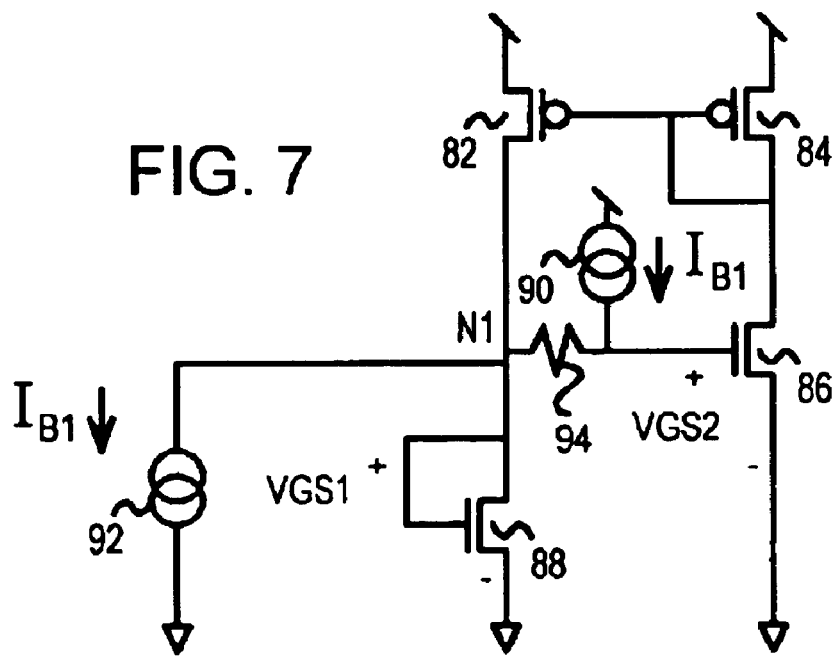
FIG. 7 highlights substituting a resistor that sets a voltage due to current injected and extracted from the circuit at the resistor terminals.

By setting voltage V, a desired Vgs–VT or ΔV may be generated using the circuit of FIG. 6. Voltage V can be produced by substituting a resistor and driving a same current into and out of the resistor. FIG. 7 highlights substituting a resistor that sets a voltage due to current injected and extracted from the circuit at the resistor terminals. The voltage source is removed and resistor 94 is inserted between the drains of transistors 82, 88 (node N1) and the gate of transistor 86. Resistor 94 creates a voltage to set ΔV. This voltage is a floating voltage source, one that is not referred to the power supply or to ground. The floating voltage source derives a voltage-to-current current from a reference voltage across a reference resistor (not shown). This current forms a precise voltage across biasing resistor 94 by current and resistance ratios from the reference resistor. The circuit works with any other form of floating voltage source. This particular one is well suited to low-voltage application.

A bias current IB1 is injected into one terminal of resistor 94 by current bias source 90. This same current IB1 is removed from the other terminal of resistor 94 by bias current sink 92. Since the same current IB1 is injected and removed from the circuit, no net current is added to node N1 by resistor 94.

This bias current IB1 can be set as IB1=V/R to produce the desired voltage drop across resistor 94 to set the gate voltage Vgs2 for transistor 86. This gate voltage Vgs2 is also the bias voltage for the current sinks 50, 52 of the first differential stage 302. Setting bias current IB1 through resistor 94 thus sets the tail current sinks.

Figure 8:
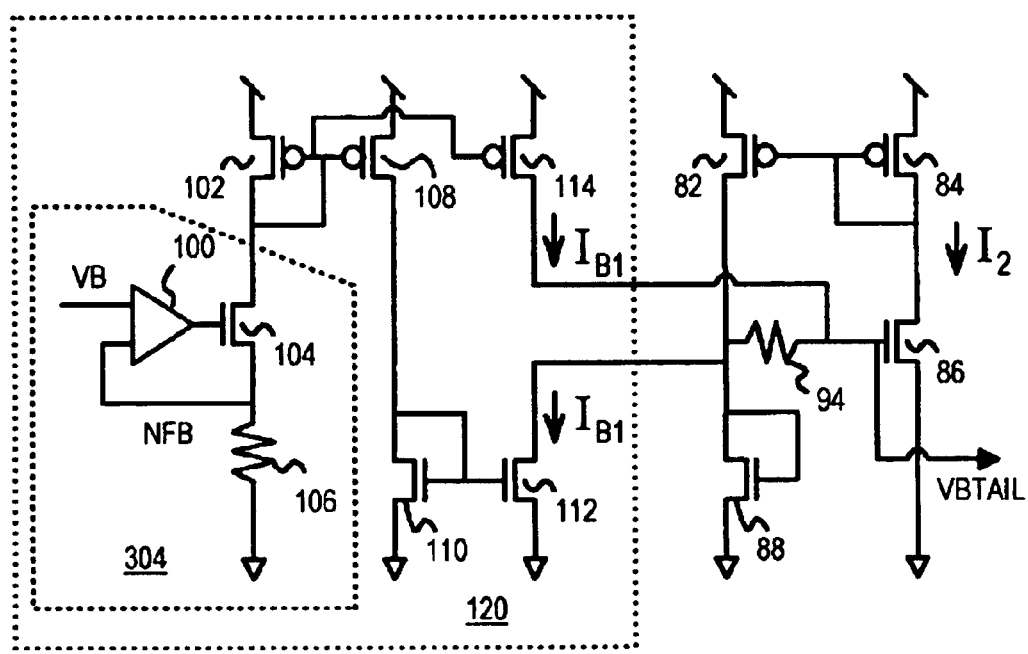
FIG. 8 is a diagram of a bias current generator.

FIG. 8 is a diagram of a bias current generator. Bias current generator 306 generates the tail voltage bias VTAIL to current sinks 50, 52. VTAIL is set by the gate voltage of n-channel transistor 86, which sinks current I2 set by mirror transistor 84. Mirror transistor 82 and n-channel transistor 88 are connected to one terminal of bias-setting resistor 94 while the gate voltage VTAIL of transistor 86 is the other terminal of resistor 94.

Current injector 120 generates and removes bias current IB1. Bias current IB1 is injected into resistor 94 by p-channel transistor 114. The same bias current IB1 is removed from the other terminal of resistor 94 by n-channel transistor 112.

Currents through transistors 114, 112 match because the gate of p-channel transistor 114 is the same node as the gate of p-channel transistor 108, and the gate of n-channel transistor 112 is the same node as n-channel transistor 110. Since transistors 108, 110 are connected together and must pass the same amount of current, the p-channel and n-channel currents must match. If the W/L sizes of the p-channel transistors 108, 114 are the same, and the W/L sizes of n-channel transistors 110, 112 are the same, then the IB1 current through transistors 108, 110 is mirrored to injected current IB1 from p-channel transistor 114 and removed current IB1 from n-channel transistor 112. The gate and drain of n-channel transistor 110 are connected together and to the gate of n-channel transistor 112.

The upper gate voltage to p-channel transistors 108, 114 is set by p-channel transistor 102, which has its gate and drain connected together. Current through p-channel transistor 102 is set by voltage-to-current reference 304. A bias voltage VB is applied to one input of comparator 100, while the other input is feedback NFB from the source of n-channel transistor 104. Comparator 100 drives the gate of n-channel transistor 104 to adjust current flow so that the source of n-channel transistor 104, NFB, is the same voltage as VB. Current from n-channel transistor 104 flowing through resistor 106 produces a voltage drop NFB that is matched to VB.

If the resistance value of resistor 94 is R1 and the resistance value of resistor 106 is R2, then V=IB1*R1 and IB1=VB/R2, when currents in p-channel transistors 102, 108, 114 are the same (same transistor sizes). Of course, scaling factors could be added when the transistor sizes are ratioed.

Combining equations V=IB1*R1 and IB1=VB/R2 produces:

$$V=VB*R1/R2.$$

Figure 9:
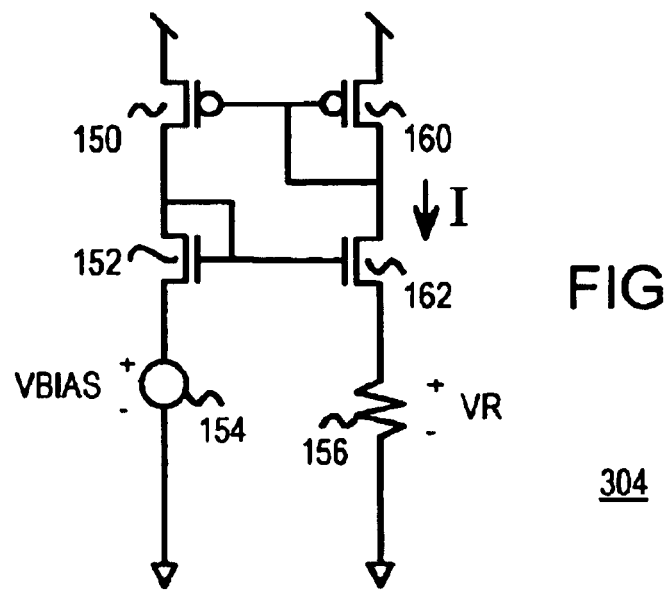
FIG. 9 shows an alternate embodiment of a voltage-to-current reference.

Rather than use the previously described voltage-to-current converter, another embodiment may be substituted such as the one shown in FIG. 9. FIG. 9 shows an alternate embodiment of an amplifier-based voltage-to-current reference.

Voltage VBIAS is generated by voltage source 154 and raises the source voltage of n-channel transistor 152. The gate and drain of n-channel transistor 152 are connected together and to the gate of n-channel transistor 162 in the other leg.

Current is sourced by p-channel transistor 150 to the drain of n-channel transistors 52, and by p-channel transistor 160 to the drain of n-channel transistor 162. The gate and drain of p-channel transistor 160 are connected together to set the gate voltage of p-channel transistors 150, 160. Resistor 156 receives current from the source of n-channel transistor 162 and sets VR.

Voltage-to-current reference 304 can generate the p-channel gate voltage to p-channel transistors 108, 114 of FIG. 8. P-channel transistor 102 in FIG. 8 is the same as p-channel transistor 160 of FIG. 9.

Figure 1:
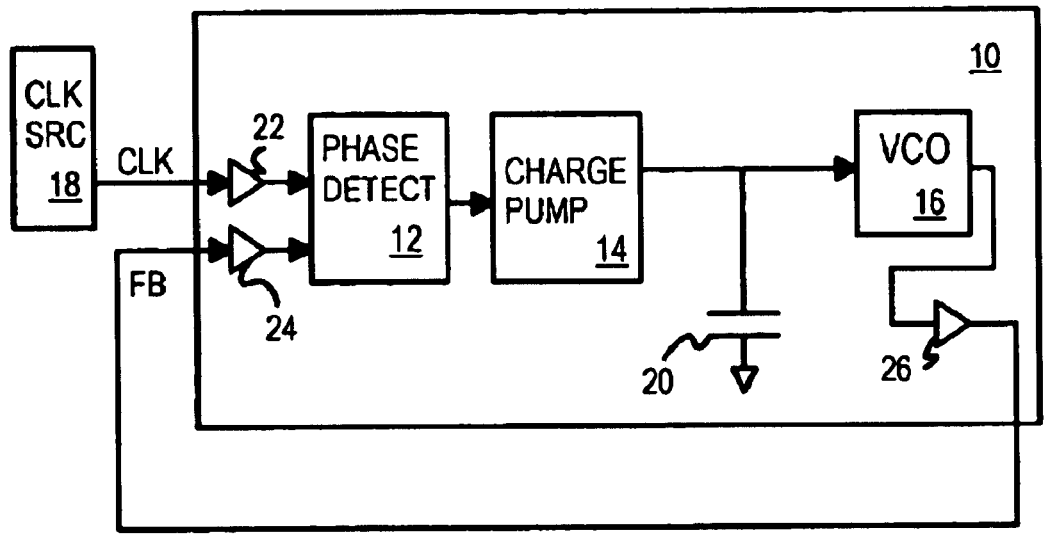
FIG. 1 shows a zero-delay buffer that requires precise delay matching.
Figure 2:
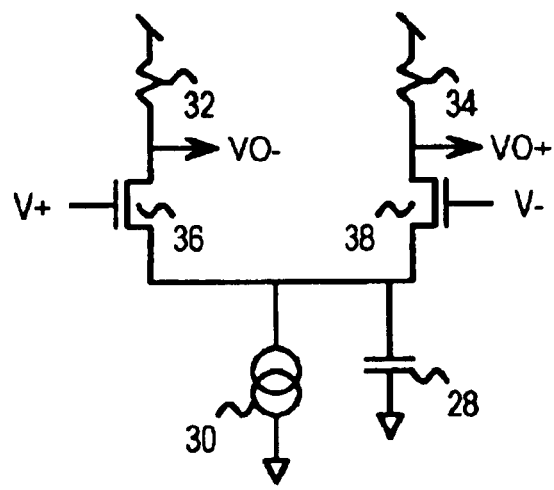
FIG. 2 shows a prior-art differential input buffer.
Figure 10:
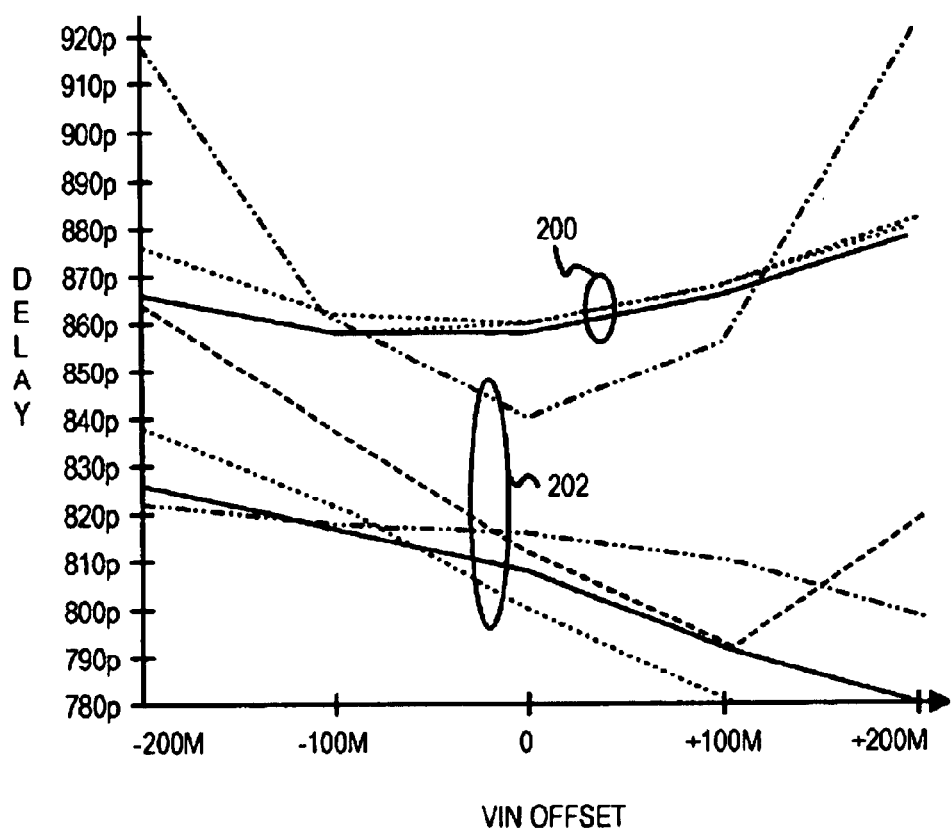
FIG. 10 is a plot of delay sensitivity to input characteristics.

FIG. 10 is a plot of delay sensitivity to input characteristics. The delay through a prior-art differential buffer such as shown in FIG. 2 is plotted as lines 202. The vertical axis is delay while the horizontal axis is the common-mode offset. The four lines in lines 202 are for different input amplitudes, or the maximum difference of V+ and V-. The amplitude difference is stepped from 0.6 to 1.8 volts in four steps.

The same conditions of input common-mode offset and amplitude difference are plotted as lines 200 for the clamped differential buffer of FIGS. 3–8. While the overall delay is higher due to the added delay of the input clamp, the variation in delay is greatly reduced.

For example, at an offset of −200 MilliVolt delay for the prior-art buffer varies from 820 pico-seconds (ps) to 920 ps, a difference in delay of 100 ps. In contrast, at the same −200 millivolt offset, the clamped buffer has a minimum delay of 865 ps and a maximum delay of 880 ps, for a difference in delay of only 15 ps. At the midrange of zero offset, the delay range is reduced from 40 ps (840–800 ps) for the standard buffer to 3 ps (860–857 ps) for the new clamped buffer. Thus delay range and sensitivity to amplitude is reduced by more than a factor of 10.

Alternate Embodiments

Several other embodiments are contemplated by the inventor. For example additional components such as transistors, capacitors, resistors and inductances can be added. Transistor polarities can be reversed with straight-forward design changes. Any voltage-to-current converter and controlled bias can be used with the amplifier.

The need for matched input buffers can occur on many other kinds of circuits besides zero-delay buffers. High-speed data busses may benefit from better-matches input buffers, address and control signals that match more closely may allow a system to be run at a higher rate, and communication lines may benefit from better signal matching. Output buffers or general drivers could benefit from the invention, because their delays could match. Data and other communication receivers would benefit also, because different inputs would have equal delays.

Other bias-voltage generators, clamps, and differential stages can be substituted. For example amplifiers with active loads and clamps could be used instead of resistors. A fixed current could be used for the bias generator. A differential clamp of the passive or active variety could be used instead of one referred to the supplies. Resistor loads could be added above the differential transistors in the first differential stage. Rather than use resistor loads, transistor loads can be used, and controlled bias voltages can drive gates of these load transistors.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. § 1.72(b). Any advantages and benefits described may not apply to all embodiments of the invention. When the word "means" is recited in a claim element, Applicant intends for the claim element to fall under 35 USC § 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC § 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A differential input buffer comprising:

a true differential input and a complement differential input;

a clamp circuit that receives the true differential input and the complement differential input and outputs a true clamped differential input and a complement clamped differential input, wherein the clamp circuit outputs a lower limit voltage as the true clamped differential input when the true differential input is below a minimum input voltage, wherein the clamp circuit outputs the lower limit voltage as the complement clamped differential input when the complement differential input is below the minimum input voltage; and a differential stage, receiving the true and complement clamped differential inputs from the clamp circuit, and outputting a true and a complement differential output, wherein the differential stage comprises:

a first tail current sink;

a first differential transistor having a gate that receives the true clamped differential input and a source connected to the first tail current sink;

a first middle transistor having a gate that receives a middle voltage between voltages of the true clamped differential input and the complement clamped differential input, and a source connected to the first tail current sink;

a second tail current sink;

a second differential transistor having a gate that receives the complement clamped differential input and a source connected to the second tail current sink;

a second middle transistor having a gate that receives the middle voltage and a source connected to the second tail current sink; and a middle current source for generating a current that branches to the first and second middle transistors, whereby the true and complement differential inputs are clamped to the lower limit voltage before being applied to the differential stage.

2. The differential input buffer of claim 1 wherein the differential input buffer receives a reference clock and drives a phase detector of a phase-locked loop (PLL) and wherein a second differential input buffer of a same design receives a feedback clock and drives a feedback input to the phase detector.

3. The differential input buffer of claim 1 wherein the minimum input voltage is an absolute value of a threshold voltage of a p-channel transistor.

4. The differential input buffer of claim 3 wherein the clamp circuit outputs an upper limit voltage as the true clamped differential input when the true differential input is above a maximum input voltage, wherein the clamp circuit outputs the upper limit voltage as the complement clamped differential input when the complement differential input is above the maximum input voltage.

5. The differential input buffer of claim 4 wherein the differential stage further receives a middle voltage that is between the lower limit voltage and the upper limit voltage.

6. The differential input buffer of claim 1 wherein of claim 1 wherein the clamp circuit comprises:

a first follower transistor that receives the true differential input at a gate, and has a source driving a first node;

a first clamp transistor having a gate coupled to the first node and a drain driving the true clamped differential input;

a second follower transistor that receives the complement differential input at a gate, and has a source driving a second node; and a second clamp transistor having a gate coupled to the second node and a drain driving the complement clamped differential input.

7. The differential input buffer of claim 6 wherein when the true differential input is at the minimum input voltage, the first node is below a threshold voltage of the first clamp transistor, wherein the first clamp transistor is turned off;

wherein when the complement differential input is at the minimum input voltage, the second node is below a threshold voltage of the second clamp transistor, wherein the second clamp transistor is turned off.

8. The differential input buffer of claim 7 wherein the clamp circuit further comprises:

a first voltage divider having a first pullup resistor and a first pulldown resistor attached to the true clamped differential input;

a second voltage divider having a second pullup resistor and a second pulldown resistor attached to the complement clamped differential input.

9. The differential input buffer of claim 6 wherein the first and second follower transistors are n-channel transistors and the first and second clamp transistors are p-channel transistors, or the first and second follower transistors are p-channel transistors and the first and second clamp transistors are n-channel transistors.

10. The differential input buffer of claim 9 further comprising:

a bias-voltage generator for generating a bias voltage to the first and second tail current sinks, the bias-voltage generator comprising:

a bias resistor for setting the bias voltage;

a bias current injector for injecting a bias current into a first terminal of the bias resistor; and a bias current remover for removing the bias current from a second terminal of the bias resistor.

11. The differential input buffer of claim 1 wherein the differential input buffer is integrated onto a chip having several of the differential input buffers in parallel.

12. A reduced-input-sensitivity buffer comprising:

a first differential input and a second differential input being driven in opposite directions during transfers of information;

input clamp means, receiving the first and second differential inputs, for generating first and second clamped inputs having voltages limited to a reduced voltage range that is reduced from a voltage range of the first and second differential inputs;

differential amplifier means, receiving the first clamped input and the second clamped input, for amplifying a difference in voltage between the first and second clamped inputs to generate an output;

bias generator means, coupled to the differential amplifier means, for generating a bias voltage to control currents in the differential amplifier means in response to a reference current; and voltage-current converter means, coupled to receive a reference voltage, for generating the reference current in response to the reference voltage, wherein the differential amplifier means comprises:

first differential transistor means, receiving the first clamped input at a gate, for conducting a first current in response to the first clamped input;

first reference transistor means, receiving a mid voltage near a middle of the reduced voltage range of the first and second clamped inputs, for delivering a first reference current;

first current means, coupled to the first differential transistor means and to the first reference transistor means, for combining the first current with the first reference current;

first output means, coupled to a drain terminal of the first reference transistor means while a source terminal of the first reference transistor means is coupled to the first current means, for outputting a first output;

second differential transistor means, receiving the second clamped input at a gate, for conducting a second current in response to the second clamped input;

second reference transistor means, receiving the mid voltage near a middle of the reduced voltage range of the second and second clamped inputs, for delivering a second reference current;

second current means, coupled to the second differential transistor means and to the second reference transistor means, for combining the second current with the second reference current;

second output means, coupled to a drain terminal of the second reference transistor means while a source terminal of the second reference transistor means is coupled to the second current means, for outputting a second output, whereby differential inputs are claimed to reduce sensitivity.

13. The reduced-input-sensitivity buffer of claim 12 wherein the differential amplifier means further comprises:

first load means, coupled to the drain terminal of the first reference transistor means, for supplying a first load current to the first reference transistor means and to the first output;

second load means, coupled to the drain terminal of the second reference transistor means, for supplying a second load current to the second reference transistor means and to the second output.

14. The reduced-input-sensitivity buffer of claim 13 wherein the first current means comprises a first current source transistor means for conducting a current in responsive to a first biased gate;

wherein the second current means comprises a second current source transistor means for conducting a current in responsive to a second biased gate;

wherein the bias generator means further comprises:

bias resistor means for generating a voltage step in response to an injected current;

current injector means, coupled to a first terminal of the bias resistor means, for injecting a bias current into the bias resistor means;

current remover means, coupled to a second terminal of the bias resistor means, for removing the bias current from the bias resistor means; and current mirror means, receiving the reference current, for generating the bias current by mirroring a gate voltage.

15. The reduced-input-sensitivity buffer of claim 14 wherein the input clamp means comprises:

first follower transistor means, having a gate receiving the first differential input, for shifting a voltage of the first differential input to generate a first shifted voltage;

first clamp transistors means, having a gate receiving the first shifted voltage, for conducting current to generate the first clamped input when the fist shifted voltage is within a voltage range that corresponds to the reduced voltage range, but for turning off and not conducting current when the first shifted voltage is outside the voltage range that corresponds to the reduced voltage range;

first voltage divider means, coupled to the first clamped input, for generating a limited voltage on the first clamped input when the few clamp transistor means is turned off;

second follower transistor means, having a gate receiving the second differential input, for shifting a voltage of the second differential input to generate a second shifted voltage;

second clamp transistors means, having a gate receiving the second shifted voltage, for conducting current to generate the second clamped input when the second shifted voltage is within a voltage range that corresponds to the reduced voltage range, but for turning off and not conducting current when the second shifted voltage is outside the voltage range that corresponds to the reduced voltage range;

second voltage divider means, coupled to the second clamped input, for generating a limited voltage on the second clamped input when the second clamp transistor means is turned off.

16. A buffer comprising:

a first differential input;

a second differential input;

a first clamp that receives the first differential input and outputs a first clamped input;

a second clamp that receives the second differential input and outputs a second clamped input;

a first differential transistor having a gate that receives the first clamped input and a source coupled to a first tail node;

a fist reference transistor having a gate receiving a reference voltage and a source coupled to the first tail node and a drain coupled to a first output;

a first load coupled to the first output;

a first tail current transistor having a gate receiving a bias voltage and a drain coupled to the first tail node;

a second differential transistor having a gate that receives the second clamped input and a source coupled to a second tail node;

a second reference transistor having a gate receiving the reference voltage and a source coupled to the second tail node and a drain coupled to a second output;

a second load coupled to the second output;

a second tail current transistor having a gate receiving the bias voltage and a drain coupled to the second tail node;

a combining load coupled to the first load and to the second load; and a bias-voltage generator for generating the bias voltage to the first and second tail current transistors, whereby input voltages are clamped before application to the first and second differential transistors.

17. The buffer of claim 16 wherein the first clamp comprises:

a first follower load;

a first follower transistor having a gate receiving the first differential input and a first source coupled to the first follower load;

a first clamp transistor having a gate coupled to the first source and a drain coupled to the first clamped input;

a first voltage divider coupled to the first clamped input;

a second follower load;

a second follower transistor having a gate receiving the second differential input and a second source coupled to the second follower load;

a second clamp transistor having a gate coupled to the second source and a drain coupled to the second clamped input; and a second voltage divider coupled to the second clamped input, wherein the first clamp transistor turns off when the first differential input is outside of a desired input-voltage range;

wherein the second clamp transistor turns off when the second differential input is outside of a desired input-voltage range.

18. The buffer of claim 17 wherein the first and second follower transistors, the first and second differential transistors, the first and second reference transistors, and the first and second tail current transistors are n-channel transistors;

wherein the first and second clamp transistors are p-channel transistors;

wherein the first, second, and combining loads and the first and second follower loads are resistors or are transistors.

19. The buffer of claim 16 wherein the bias-voltage generator comprises:

a first source transistor having a gate and a drain connected together as a first upper voltage;

a middle source transistor having a gate driven by the first upper voltage, for generating a middle current;

a injector transistor having a gate driven by the first upper voltage, for generating an injected current;

a middle sink transistor, receiving the middle current from the middle source transistor, having a gate and a drain connected together as a lower voltage;

a remover transistor having a gate driven by the lower voltage, for generating a removed current;

a second source transistor having a gate driven by a second upper voltage, for generating a second reference current to a first terminal node;

a second sink transistor, receiving the second reference current, having a gate and a drain connected together at the first terminal node;

a third source transistor having a gate and a drain connected together to generate the second upper voltage, for generating a third reference current;

a third sink transistor, receiving the third reference current at a drain, having a gate connected to a second terminal node;

a bias resistor coupled between the first and second terminal nodes;

wherein the second terminal node produces the bias voltage to gates of the first and second tail current transistors.

* * * * *